(12) United States Patent
Teng et al.

(10) Patent No.: US 6,294,058 B1
(45) Date of Patent: Sep. 25, 2001

(54) ENHANCED METHODS AND APPARATUS FOR PRODUCING MICRO-TEXTURED, THIN FILM, MAGNETIC DISC MEDIA AND COMPOSITELY MICRO-TEXTURED DISC MEDIA PRODUCED THEREBY

(75) Inventors: Edward F. Teng, Sunnyvale; Atef H. Eltoukhy, Saratoga; Bryan K. Clark, Sunnyvale; Wilfred M. Goh, San Jose, all of CA (US)

(73) Assignee: United Module Corporation, Los Altos, CA (US)

( * ) Notice: Subject to any disclaimer, the term of this patent is extended or adjusted under 35 U.S.C. 154(b) by 0 days.

(21) Appl. No.: 08/275,969

(22) Filed: Jul. 15, 1994

(51) Int. Cl.$^7$ .................................................. C23C 14/34
(52) U.S. Cl. .................. 204/192.15; 204/192.2; 204/192.3; 427/129; 216/80; 216/97; 216/100; 216/75
(58) Field of Search ....................... 204/192.15, 192.16, 204/192.2, 192.3, 192.26; 156/625.1, 646.1, 663, 664, 214; 427/128, 129; 216/75, 80, 97, 100

(56) References Cited

U.S. PATENT DOCUMENTS

| | | | |
|---|---|---|---|
| 4,734,810 | * | 3/1988 | Nakayama et al. .................. 360/131 |
| 5,134,038 | * | 7/1992 | Baseman et al. ..................... 428/611 |
| 5,166,006 | * | 11/1992 | Lal et al. .............................. 428/612 |

FOREIGN PATENT DOCUMENTS

| | | | |
|---|---|---|---|
| 0579399 | * | 1/1994 | (EP) . |
| 2202866 | * | 10/1988 | (GB) ................................ 204/192.2 |

* cited by examiner

*Primary Examiner*—Rodney G. McDonald
(74) *Attorney, Agent, or Firm*—Law+

(57) ABSTRACT

Compositely micro-textured thin film, magnetic disc media, with methods and apparatus for producing such, which are characterized by the incorporation of a first stage of micro-texturing provided by etching of a disc substrate, with a second, disparate, micro-texturing stage depositing rounded globules of eutectic alloy on the etched substrate.

15 Claims, 5 Drawing Sheets

ENHANCED METHODS AND APPARATUS FOR PRODUCING MICRO-TEXTURED, THIN FILM, MAGNETIC DISC MEDIA AND COMPOSITELY MICRO-TEXTURED DISC MEDIA PRODUCED THEREBY

GENERAL BACKGROUND OF INVENTION

As thin film magnetic disc media has evolved, continuing problems have persisted with respect to the attainment of optimal disc operating conditions and magnetic properties.

One particular problem of concern has involved the maintenance of suitable, low friction characteristics on the exposed disc surface, this traditionally being attained by fluid lubricant materials applied to the disc surface to be read by a magnetic head.

While efforts to apply and maintain such lubricant coatings have engendered substantial research effort, particular attention has been devoted to the formation of roughened or textured media surfaces. These textured surfaces provide alternating arrays of recesses and peaks which are intended to prevent migration of lubricant and undesired, localized lubricant build-up or loss and reduce friction and sticking between the disk and landed head, ie., reduce stiction.

The disadvantage of providing such texturing (usually mechanical) is that it frequently caused undesired, extremely high modulation disparity due to the differences in elevation between portions of the thin film media being traversed by the magnetic head and also tended to cause head damage. (As used herein, the term elevation refers to the difference in displacement of features as measure generally parallel to the axis of disc rotation.)

The present invention is uniquely concerned with the presentation of new and enhanced micro-texturing techniques and apparatus, and the resulting thin film, magnetic media disc product, such being characterized by the attainment of tightly controlled, and localized modulation disparity, which is confined to normal head landing zones, while effectively controlling the distribution of lubricant during disc operation so as to avoid head sticking problems, commonly referred to as "stiction", such problems being produced when heads inadvertently come to rest on disc areas having excessive lubricant accumulation. In addition, optimal head glide characteristics are preserved.

The unique texturing approach of this invention is characterized by composite, physically and chemically disparate, composite micro-texturing which produces synergistic benefits in providing extraordinarily improved modulaltion and virtual elimination of stiction in the head landing zone and across the remainder of the disc.

Invention Overview—Presently Preferred Embodiment

The first stage of the implementation of this invention preferably entails the use of removable masking and chemical etching to form recesses in the surface of a glass substrate.

In the second stage of this composite micro-texturing process, a eutectic seed layer and micro-texturing treatment is implemented over the top of the etched valleys and resulting peaks of the glass substrate so as to provide a solidified eutectic alloy, rounded globule-defined, peak-type texturing, superimposed on top of the etched valley/peak roughness. Preferably these solidified eutectic alloy globules comprise a eutectic Indium and Bismuth alloy.

It is significant to here note that both the physical and chemical charactertistics of the two separate texturing stages are fundamentally distinct.

The first stage, involving masking and etching, will produce an eroded valley/peak configuration in the substrate which is much different from the rounded, solidified, eutectic alloy, globule peak structure resulting in the second stage from the micro-texturizing globule deposition treatment.

General Discussion of the Art

With respect to the use of multiple texturizing steps, a European Patent Application 579 399 A2 (Wilson et al), filed by Pilkington Brothers P. L. C., expressly recognizes the possibility of a supplemental texturizing step, designed to follow an initial masking/etching step. As is set forth on page 6 of the specification of this EPO application:

> Although an acceptable texture can be obtained by the use of the etching step as a final texturing step of the glass substrate, it is, in accordance with the present invention, possible additionally to incorporate a further post etch treatment of the glass surface so as to further to modify the texture of the surface. For example, the etched surface may be treated by very light polishing or by other forms of additional whole surface etching, which may be either wet etching or dry etching. This further processing step may be employed either to roughen the surface or further to smooth the peaks of the texture, depending on the requirements of the particular product which is being manufactured. Thus the man skilled in the art will appreciate that the present invention provides a comprehensive scheme for manufacturing a glass disc substrate for a magnetic disc with the desired texture.

Moreover, a much earlier Fujitsu et al patent, i.e., Sakai et al U.S. Pat. No. 4,675,075, also discloses a multi-stage technique for providing texturing on a metallic substrate such as an aluminum substrate.

This technique employs masking/etching in both stages, with the first stage producing eroded valleys in the substrate (FIG. 9(4)) and the second stage producing a peak-type, eroded layer, deposited on top of the valley-containing base.

With respect to the alloy globule features of the present invention, prior art United States patents such as Baseman et al U.S. Pat. No. 5,1334,038 (1992) and U.S. Pat. No. 5,053,250 (1991) do disclose a form of globule texturing. However, these IBM patents appear to be restricted to situations where there is an interaction between the magnetic media layer and globules while they are in a transient, liquid stage. No such phenomena is believed to be involved in connection with the eutectic alloy approach of this present invention.

General State of the Art Summary

By way of summarizing the general state of the art, the following compilation of United States patents, in addition to the Pilkington EPO application noted above, generally are indicative of the various approaches which have been pursued in connection with micro-texturing technology. In this compilation, at the end of each patent title, a code has been applied, generally indicating the principle nature of the disclosure, with the meaning of these codes being identified in the code table at the end of the patent listing.

| U.S. PAT. NO. | INVENTOR | ASSIGNEE | TITLE (SUBJECT) |
|---|---|---|---|
| 3,019,125 | Eggenberger et al | IBM | Thin Magnetic Film (CG) |
| 3,193,362 | Hespenheide | Burroughs Corp. | Magnetic Materials (M) |
| 4,326,229 | Yanagisawa | Nippon Electric Co. | Magnetic Record Member And Process for Manufacturing The Same (M) |
| 4,499,122 | Economy et al | IBM | Process For Finishing Surfaces Achieving Improved Mangetic Disk Performance (P) |
| 4,616,237 | Pettigrew et al | Pa Management Consultants, Ltd. | Data Storage Medium (CG) |
| 4,675,075 | Sakai et al | Fujitsu Limited | Magnetic Recording Production Processes (ME) (H) |
| 4,698,251 | Fukuda et al | Victor Company of Japan, Limited | Magnetic Recording Medium And Method Of Producing The Same (CG) |
| 4,724,444 | Pettigrew et al | Plasmon Data Systems, Inc. | Data Storage Medium (CG) |
| 4,734,810 | Nakayama et al | TDK Corporation | Magnetic Recording Medium Comprising Protrusion On Its Surface And A Plasma Treated Substrate And Recording/ Reproducing Method Therefor (PE) |
| 4,375,840 | Hedgcoth | Cyberdisk, Inc. | Magnetic Recording Disk And Sputtering Process And Apparatus For Producing Same (CG) |
| 4,828,899 | Arioka et al | TDK Corporation | Magnetic Recording Medium And Recording/ Reproducing Method Thereof (P) |
| 4,833,001 | Kijima et al | Asahi Glass Company, Ltd. | Glass Substrate For A Magnetic Disc And Process For Its Production (CE) |
| 4,894,133 | Hedgcoth | Virgle L. Hedgcoth | Method And Apparatus Making Magnetic Recording Disk (CG) |
| 4,925,738 | Tsuya et al | — | Substrate For A Mangetic Disk And Process For Its Production (PO) (CB) |
| 4,393,614 | Shirakura et al | Hitachi, Ltd. | Magnetic Disk Medium With Circumferentially Textured Surfaces And Varied Surface Roughness And Method Of Producing Same (CG) |
| 4,973,496 | Kruger et al | IBM | Method For Texturing Magnetic Disks (CG) |
| 4,985,306 | Morizane et al | — | Base Plate For Recording Disk And A Method For Its Manufacture (CE) |
| 4,996,622 | Takatsuki et al | Nippon Sheet Glass Co., Ltd. | Magnetic Disk With Textured Area On Part Of Disk (CG) |
| 5,047,274 | Tsuya et al | — | Annodized Aluminum Substrate For A Magnetic Recording Disk In Which Pores Are Filled With A Non Magnetic Material And The Surface Polished And Etched (PP) |
| 5,053,250 | Baseman et al | IBM | Thin Film Magnetic Medium With Controlled Grain Morphology And Topology For Improved Performance (G) |
| 5,062,021 | Ranjan et al | Magnetic Peripherals, Inc. | Selectively Textured Magnetic Recording Media (L) |
| 5,070,425 | Inumoch | Mitsubishi Denki Kabushiki Kaisha | Surface Structure Of A Magnetic Disk (CG) |
| 5,074,971 | Tsuya et al | — | Process For Preparing Magnetic Disk (PO) (CE) |
| 5,079,062 | Masuda et al | Hitachi, Ltd. | Magnetic Recording Medium Having A Thin Film Magnetic Layer Formed Over A Non-Magnetic Substrate Which Has Powder Grains Of The Substrate Dipsosed On Its Surface (P) |
| 5,082,709 | Suzuki et al | Matsushita Electric Industrial Co., Ltd. | Thin Film-Type Magnetic Disk (P) |
| 5,082,747 | Hedgcoth | — | Magnetic Recording Disk And Sputtering Process And Apparatus For Producing Same (CG) |
| 5,087,481 | Chen et al | Komag, Inc.; Asahi Glass Co., Ltd. | Method For Texturing A Magnetic Disk Silicate Glass Substrate (CB) |
| 5,087,482 | Kawai et al | Hoya Corporation | Method Of Manufacturing Magnetic Recording Medium Capable Of Recording Information At A High Recording Density (P) |
| 5,091,225 | Goto | NBC Corporation | Magnetic Disk Member And Process For Manufacturing The Same (P) |
| 5,093,173 | Nakagawa et al | Hitachi, Ltd. | Magnetic Disk Comprising A Substrate Of An Amorphous Glass Continuous Phase Dispersed With Crystal Particles Which Produce A Structurally Defined |

-continued

| U.S. PAT. NO. | INVENTOR | ASSIGNEE | TITLE (SUBJECT) |
|---|---|---|---|
| 5,108,781 | Ranjan et al | Magnetic Peripherals, Inc. | Surface On The Substrate (CB) Process For Manufacturing Selectively Textured Mangetic Recording Media (PP) |
| 5,108,812 | Takahashi et al | — | Substrate For A Magnetic Disk And Process For Its Production (PP) |
| 5,119,258 | Tsai et al | HMT Technology Corporation | Magnetic Disk With Low-Friction Glass Substrate (PE) |
| 5,134,038 | Baseman et al | IBM | Thin Film Magnetic Recording Medium With Controlled Grain Morphology And Topology (G) |
| 5,166,006 | Lal et al | HMT Technology Corporation | Textured Thin-Film Substrate And Method (P) |
| 5,209,837 | Tsuya et al | — | Process For Preparing Magnetic Disk (PB) (CE) |
| 5,210,673 | Ito et al | Hitachi Metals, Ltd. | Thin-Film Hard Disk Magnetic Medium (CG) |
| 5,223,304 | Yasuda et al | Sumitomo Metal Mining Company, Ltd. | Process For Fabricating Mangetic Disks (P) |
| 5,225,955 | Ito et al | Hitachi Metals, Inc. | Disk-Shaped Magnetic Recording Medium Having Novel Textured Surface (CG) |
| 5,232,750 | Onodera et al | Fuji Electric Co., Ltd. | Method For Fabricating Mangetic Recording Medium (US) |
| 5,250,339 | Tani et al | Nihon Shinku Gijutsu Kabushiki Kaisha | Magnetic Recording Medium (CG) |
| 5,268,207 | Kruger et al | IBM | Texturing The Surface Of A Recoridng Disk Using Particle Impact (US) |
| 5,285,343 | Tanaka et al | Hitachi, Ltd. | Magnetic Disk With Surface Protective Layer Having Convex Portions And Magnetic Disk Apparatus Including Such A Magnetic Disk (E) |
| 5,316,864 | Hedgcoth | — | Sputtered Magnetic Recording Disc (CG) |

CODE TABLE

CE—Chemical Etching
CG—Circumferential Grooving
G—Globule
H—Heat
L—Laser
M—Miscellaneous Mechanical
ME—Masking/Etching
P—Particles
PE—Plasma Etching
PO—Pores
PP—Pore Packing
US—Ultra Sonic

GENERAL SUMMARY OF INVENTION

Having described the general state of the prior art and principle aspects of the invention, it is now appropriate to review the invention with respect to its independently significant aspects.

Basic Aspects

A principle method aspect of the inventions resides in the following concept:

A method of compositely micro-texturing thin film, magnetic discs, this method comprising:

a) providing a disc substrate;

b) etching the substrate to provide a first, spaced array of micro-texturing components comprising dispersed recesses projecting inwardly into the body of the substrate and defining a first array of dispersed peaks; and     c) sputter depositing a second, spaced array of micro-texturing components comprising spaced, generally rounded globules superimposed over the etched substrate and recesses projecting thereunto, with the second, spaced array projecting upwardly generally away from the etched substrate and recesses projecting thereunto and defining a second array of dispersed peaks elevated from the first array of dispersed peaks;

d) the sputter deposited globules comprising a material whose chemical composition is diverse from that of said etched substrate; and     e) the etching and depositing being operable to form a compositely micro-textured substrate for receiving sputter deposited, thin-film, magnetic media, which substrate is characterized by         i) superimposed, physically disparate, micro-texturing defined by rounded globules projecting outwardly of said substrate and etched recesses projecting inwardly into said substrate, and         ii) superimposed, chemically disparate, micro-texturing defined by said superimposed first and second arrays of micro-texturing components comprised of diverse chemical compositions.

An independently significant, basic apparatus aspect of the invention may be summarized as follows:

Apparatus for compositely micro-texturing thin film, magnetic discs, this apparatus comprising:

a) means providing a disc substrate;

b) means for etching the substrate to provide a first, spaced array of microtexturing components comprising dispersed recesses projecting inwardly into the body of the substrate and defining a first array of dispersed peaks; and     c) means for sputter depositing a second, spaced array of micro-texturing components comprising spaced, generally rounded globules superimposed over the etched substrate and recesses projecting thereunto, with the second, spaced array projecting upwardly, generally away from the etched substrate and recesses projecting thereunto and defining a second array of dispersed peaks elevated from the first array of dispersed peaks;

d) the sputter deposited globules comprising a material whose chemical composition is diverse from that of the etched substrate; and e) the etching and depositing being operable to form a compositely micro-textured substrate for receiving sputter deposited, thin-film, magnetic media, which substrate is characterized by
   i) superimposed, physically disparate, micro-texturing defined by rounded globules projecting outwardly of said substrate and etched recesses projecting inwardly into said substrate, and
   ii) superimposed, chemically disparate, micro-texturing defined by said superimposed first and second arrays of micro-texturing components comprised of diverse chemical composition.

The enhanced, compositely micro-textured thin-film magnetic disc produced by the present invention may be characterized, in basic terms, as follows:

A compositely micro-textured thin film, magnetic disc, this disc comprising:

a) a disc substrate;

b) an etched portion of the substrate providing a first, spaced array of micro-texturing components comprising dispersed recesses projecting inwardly into the body of the substrate and defining a first array of dispersed peaks; and c) a sputter deposited second, spaced array of micro-texturing components comprising spaced, generally rounded globules superimposed over the etched substrate and recesses projecting thereunto, with the second, spaced array projecting upwardly, generally away from the etched substrate and recesses projecting thereunto and defining a second array of dispersed peaks elevated from the first array of dispersed peaks;

d) the sputter deposited globules comprising a material whose chemical composition is diverse from that of the etched substrate;

e) the etching and depositing being operable to form a compositely micro-textured substrate for receiving sputter deposited, thin-film, magnetic media, which substrate is characterized by
   i) superimposed, physically disparate, micro-texturing defined by rounded globules projecting outwardly of the substrate and etched recesses projecting inwardly into the substrate, and
   ii) superimposed, chemically disparate, micro-texturing defined by the superimposed first and second arrays of micro-texturing components comprised of diverse chemical composition; and f) sputter deposited, thin film, magnetic media deposited over the compositely micro-textured substrate and being itself micro-textured in response to the presence of the composite, micro-texturing of the substrate.

Detailed Aspects

Independently significant aspects of each of the foregoing method, apparatus, and disc components of the invention reside in specific, functional and micro-texturing array parameters as follows.

Modulation confinement, coupled with maintenance of optimal head glide characteristics and overall stiction control and/or substantial elimination is achieved through the following concept:

the first, spaced array of micro-texturing components is confined to an inner diameter portion of the disc substrate, over which a magnetic head would come to rest in response to a normal cessation of disc traversing operations;

the second, spaced array of micro-texturing components, comprising the generally rounded globules, is dispersed so as to overlie the inner diameter portion of the substrate and extend radially outwardly thereof;

the confining of the first, spaced array of micro-texturing to an inner diameter portion of the substrate substantially confines modulation disparities resulting from the etching to a normal, head landing zone over the substrate; and the overlapping portion and radially outward extension, of the second, spaced array of micro-texturing components, comprising the generally rounded globules, define a stiction resistant area substantially covering the entire portion of the substrate traversed by the magnetic head without significantly impairing or deteriorating glide characteristics of a magnetic head, radially outward of the normal head landing zone.

The attainment of significant results of the invention may be ascribable in substantial part to the relative characteristics of peak dispersed or frequency (i.e., spacing between peaks as measured normal to the axis of disc rotation) and peak elevation, in relation to each of the two different micro-textured zones, i.e, the etched zone and the globule zone, this concept being set forth as follows:

the first array of dispersed peaks is characterized by a relatively low frequency of occurance and has an average peak spacing, measured across the substrate, which is substantially greater than the average peak spacing of the generally rounded globules; and said first array of dispersed peaks is characterized by relatively low elevation having an average elevation, measured normal to the substrate, which is substantially less than the average peak elevation of the generally rounded globules measured normal to and relative to a plane of the substrate containing the first array of dispersed peaks.

Specific parameters of the foregoing concept presently believed to afford optimum advantages may be stated as follows:

the average peak spacing of the first array of dispersed peaks is from about 40 to 70 microns, with
the peaks being generally columnar and having a diameter from about 10 to 30 microns;

the average peak spacing of the generally rounded globules is from about $8 \times 10^{-2}$ to about $12 \times 10^{-2}$ microns;

the average elevation of the first array of dispersed peaks is from about $1.5 \times 10^{-2}$ to $2.5 \times 10^{-2}$ microns; and the average peak elevation of the generally rounded globules is about $3 \times 10^{-2}$ to $5 \times 10^{-2}$ microns.

In an aggregate sense, the basic invention is believed to be particularly efficacious where the following combination concept is entailed:

the first, spaced array of micro-texturing components is confined to an inner diameter portion of said disc substrate, over which a magnetic head would come to rest in response to a normal cessation of disc traversing operations;

the second, spaced array of micro-texturing components, comprising the generally rounded globules, is dispersed so as to overlie the inner diameter portion of the substrate and extend radially outward thereof;

the confining of the first, spaced array of micro-texturing to an inner diameter portion of the substrate serves to substantially confine modulation disparities resulting from the etching to a normal, head landing zone over the substrate;

the overlying portion, and radialy outward extension, of the second, spaced array of micro-texturing components, comprising the generally rounded globules, define a stiction resistant area substantially covering the entire portion of the substrate traversed by the magnetic head and improve glide characteristics in the head landing zone relative to characteristics produced by the etching alone;

the first array of dispersed peaks is characterized by a relatively low frequency of occurance and has an average peak spacing, measured across the substrate, which is substantially greater than the average peak spacing of the generally rounded globules, with the average peak spacing of the first array of dispersed peaks being about 60 microns, and the peaks of the first array of dispersed peaks being generally columnar and having a diameter of about 20 microns, and the average peak spacing of the generally rounded globules being about $1 \times 10^{-1}$ microns; and the first array of dispersed peaks is characterized by relatively low elevation having an average elevation, measured normal to the substrate, which is substantially less than the average peak elevation of the generally rounded globules measured normal to and relative to a plane of the substrate containing the first array of dispersed peaks, with the average elevation of the first array of dispersed peaks being about $2 \times 10^{-2}$ microns, and the average peak elevation of the generally rounded globules being about $5 \times 10^{-2}$ microns.

Other independently significant aspects of the invention reside in the use of glass substrates, with the etching being controlled by appropriate surface masking to provide control over the area and nature of etching. All such etching operations are effected prior to the sputter deposition of arrays of globules of eutectic alloys material, presently preferred to comprise a eutectic alloy of Indium and Bismuth.

BRIEF DESCRIPTION OF DRAWINGS

In describing the invention with respect to presently preferred embodiments, reference will be made to the appended drawings in which:

FIG. 1 provides a transversely sectioned, schematic, and fragmentary view of a glass substrate of a magnetic media disc as it has been provided with appropriate patterned masking. This masking permits a subsequent selective etching into the body of the substrate, in the areas outside of the masking, so as to form spaced recesses. These recesses or valleys in the substrate inherently define peaks which terminate substantially at the original, outermost surface of the glass substrate (in this connection it will be understood that FIG. 1, in essence, schematically depicts a fragment of a quarter of a disc, i.e., the half of the disc to the right of a center line or axis of rotation as shown in FIG. 1, with only the upper portion of the glass disc substrate being illustrated and a portion only of the upper portion of the substrate to the right of the normal ID-head landing zone being shown);

FIG. 4 is a view, at a different relative scale, of the upper portion of the FIG. 2 fragmentary showing of a transversely sectioned glass disc substrate, illustrating schematically, and with appropriate dimensions shown by way of example, the relative positioning of some (but not all) of rounded globules of a eutectic alloy which had been sputtered deposited over the etched peak and valley array of FIGS. 2 and 3 (in this connection, it will be understood that while rounded globules would be sputtered deposited on both the valley bases and the peaks of the FIG. 2 micro-texturing array, FIG. 4 depicts only such globules as they are deposited on the peaks of the first etched array and globules as they would be deposited in one valley, it being understood that other valley-deposited globules are simply not shown in FIG. 4 so as to avoid excessive illustrational confusion and permit dimensions to be shown free of background disc structure);

FIG. 5 schematically illustrates the sequence of steps involved in the composite, multi-texturing concept of the present invention, illustrating the sequence through which a glass disc is 1) first masked, for example with a printed pattern. In this sequence it is shown that the disc substrate is etched in the unmasked areas to produce the aforesaid glass substrate peak/valley array (i.e., the first formed multi-texturing array). FIG. 5 further shows the sequence subsequent to this etching 2) involving 3) the removal of the originally applied masking, 4) the subsequent sputter deposition of rounded and possibly partially overlapping globules of eutectic alloy material, 5) the subsequent sputtering of media reflecting in a possibly dampened, however substantial way, the results of the composite micro-texturing resulting from the first stage of masking/etching and the second stage of sputtered deposition of rounded globules. The final step 6) shown in FIG. 5 entails the application of a protective coating to the sputter deposited magnetic media, this protective coating possibly being formed from the application of sputtered carbon followed by the application of a desired lubricant material;

DETAILED ASPECTS OF PREFERRED IMPLEMENTATION OF INVENTION

Overview

In implementing this invention, a two stage micro-texturing technique is employed which is characterized by:

1. A first micro-texturing stage involving the etching of a substrate so as to produce an alternating array of peaks and valleys, with the peaks being relatively widely spaced, i.e., characterized by a low frequency of dispersion, (i.e., a relatively low number of peaks per unit area) and with the peaks themselves being relatively wide but relatively low in elevation compared with the disparate peaks of the second stage of micro-texturing; and
2. The formation of a second, superposed stage of micro-texturing, applied subsequent to the formation of the etching-induced first stage, and characterized by the sputtered deposition of relatively minute, rounded globules, this second stage being characterized by a) a high frequency of dispersion, (i.e., a relatively high number of peaks per unit area), b) a relatively small width of apparent peaks, and c) a relatively high peak elevation, relative to the original substrate, as compared with the first stage peaks.

The first stage, preferably produced by now well known masking and etching techniques, may constitute implementation of a masking and chemical etching technique, exemplified, for example by techniques such as those disclosed in United States Sakai et al U.S. Pat. No. 4,675,075 (1987) and/or the glass substrate etching technique featured in European Patent Application Publication No. 579 399 (Wilson et al), assigned to Pilkington Brothers P. L. C. and published Jan. 19, 1994 in Bulletin 94/03. By way of providing elaboration in this disclosure as to techniques which may be employed in this aspect of the invention, the disclosures of both of these prior publications are herein incorporated by reference.

With respect to the second stage, the invention may advantageously employ the sputter deposition of globules comprising a eutectic alloy of Indium and Bismuth as featured in the publication of Teng and Eltoukhy entitled "Sputter-Induced Random Micro-Texturing On NiP Plated Aluminum And Alternate Substrates" (Teng et al, published at the 6th Joint MMM Intermag Conference at Albuquerque, N.Mex. on Jun. 20–13, 1994). The disclosure of this paper is herein incorporated by reference.

In describing the invention in greater detail, definitions of the terminology employed in the specification and claims will be consistent with the following:

| Term | Meaning |
| --- | --- |
| Frequency of micro-texturing peak occurance | The number of micro-texturing peaks per unit area of dispersion surface, expressed in terms of average spacing between peak tip centers. A low frequency entails a relatively large distance between peaks and a high frequency entails a relatively small distance between peak extremity centers. |
| Elevation of micro-texturing peaks | The average, apparent distance measured normal to the disc substrate, before micro-texturing, between a) a plane parallel to the disc substrate and aligned with the apparent, average locations of peak extremities (peak bases in the case of etching and peak tops in the case of sputtered globules) and b) the plane of the outer surface of the substrate to be micro-textured, before such occurs. |

First Stage—Masking And Etching Induced Peak/Valley Array

As is described in the European Patent Application 579, 399 and the United States Sakai et al U.S. Pat. No. 4,657,075 noted above, etched peak and valley formations and substrates may be implemented by printing or otherwise applying small masking dots or other indicia, after which chemical or plasma etching may be employed to remove material between the masked areas so as to provide valleys etched into the substrate. This process yields spaced peaks, substantially aligned with the original substrate surface. Thereafter, the printed or otherwise formed dots or masking inditure are removed, usually by cleaning or chemical solvent removing operations.

Such substrate masking and etching techniques, being broadly well recognized in the electronics art, it should be sufficient to here note that acceptable techniques for forming such etched peak/valley arrays are described in detail in the earlier noted United States Sakai et al U.S. Pat. No. 4,675,075 and Pilkington et al EPO application 579 399, the disclosures of which are herein incorporated by reference.

Etching of protective layers is also described in prior art such as the United States Tanaka et al U.S. Pat. No. 5,285,343.

Figure 2:
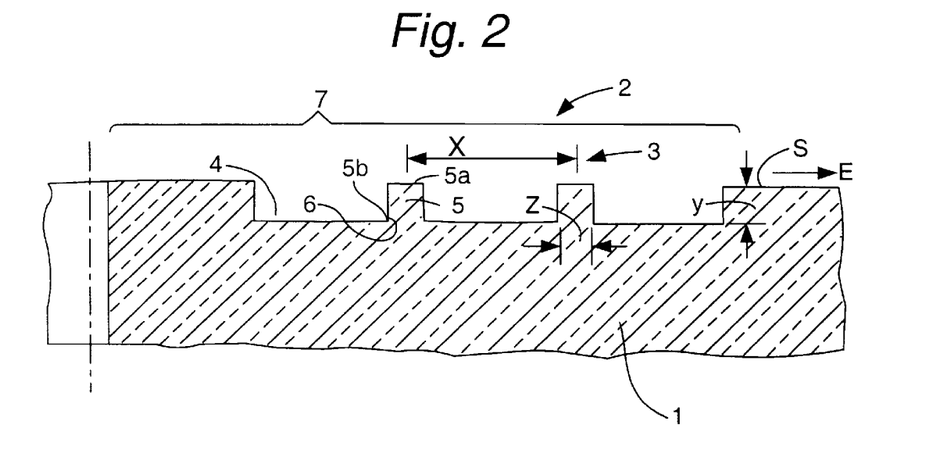
FIG. 2 schematically depicts the FIG. 2 assembly after etching as above described has been accomplished, so as to produce a first, alternating valley/peak array, comprising valleys projecting inwardly into the body of the glass substrate and peaks co-existing substantially with the original glass disc outer-most surface S, i.e., the top surface shown in FIG. 2.

By way of summary, it is noted that the masking/etching technique, as applied in this present invention, produces a disc which, as shown in FIG. 2, in an intermediate stage of manufacture, may be characterized as including:

a) a disc substrate 1 having an original outer surface S and an axis of rotation R; and
b) an etched portion 2 of the substrate 1 providing a first, spaced array 3 of micro-texturing components comprising dispersed recesses 4 projecting inwardly into the body of the substrate and defining a first array of dispersed peaks 5 on generally columnar protuberances 6, each such peak having an extremity or tip 5a and a base 5b.

Figure 3:
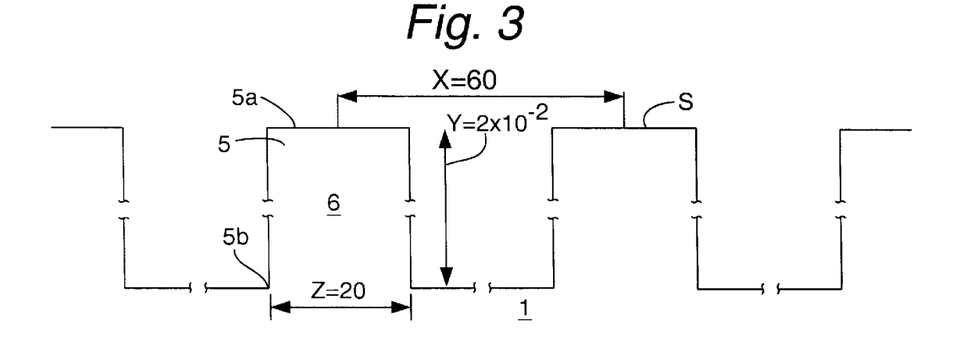
FIG. 3 schematically depicts various dimensional relationships of the peak and valley configuration of FIG. 2, illustrating one exemplary embodiment of the invention so as to provide a general indication of the relative dimensions of peaks and valleys produced by the substrate masking and etching.
Figure 4:
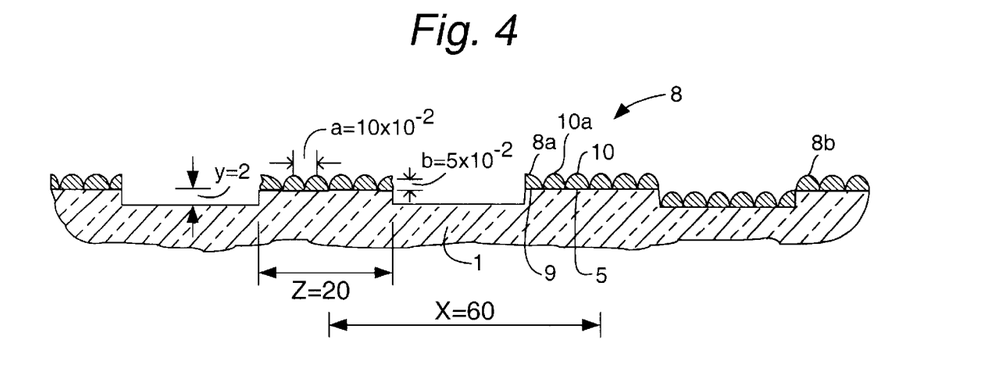

In detailed aspects, this first stage of micro-texturing, as shown in FIGS. 2 and 3 produces, in a preferred embodiment:

the first, spaced array 3 of micro-texturing components which is substantially confined to an inner diameter portion 7 of the disc substrate 1, over which a magnetic head (not shown) would come to rest in response to a normal cessation of disc traversing operations;

the confining of the first, spaced array 3 of micro-texturing to the inner diameter portion 7 of the substrate 1 substantially confining modulation disparities resulting from the etching to a normal, head landing zone 7 over the substrate 1;

the first array of dispersed peaks 5 being characterized by a relatively low frequency of occurance and having an average peak spacing x, measured across the substrate 1, which, as shown in FIG. 4, is substantially greater than the average peak spacing a of generally rounded globules of the second micro-texturing stage, with the average peak spacing x of the first array 3 of dispersed peaks 5 being about 60 microns, i.e., normally within a range of about 40 to 70 microns, and the peaks 5 of said first array 3 of dispersed peaks 5 being generally columnar 6 and having a diameter z of about 20 microns, i.e., normally within a range of about 10 to 30 microns; and the first array 3 of dispersed peaks 5 being characterized by relatively low elevation having an average elevation y, as measured from base 5a to coinciding surface 5 or tip 5b, and as measured normal to said substrate 1,which is substantially less than the average peak elevation b of the generally rounded globules measured normal to and relative to a plane or original surface S of the substrate 1, with the average elevation y of the first array 3 of dispersed peaks 5 being about $2\times10^{-2}$ microns, i.e., normally within a range of about 1.5 to $2.5\times10^{-2}$ microns.

The micro-texturing pattern contemplated in this invention may be produced by the printing of removable, etch resistent dots or indicia on the substrate surface S as described, for example, in the aforesaid Pilkington EPO application, with alternative available techniques being described in the above noted Sakai et al U.S. Pat. No. 4,675,075.

Figure 1:
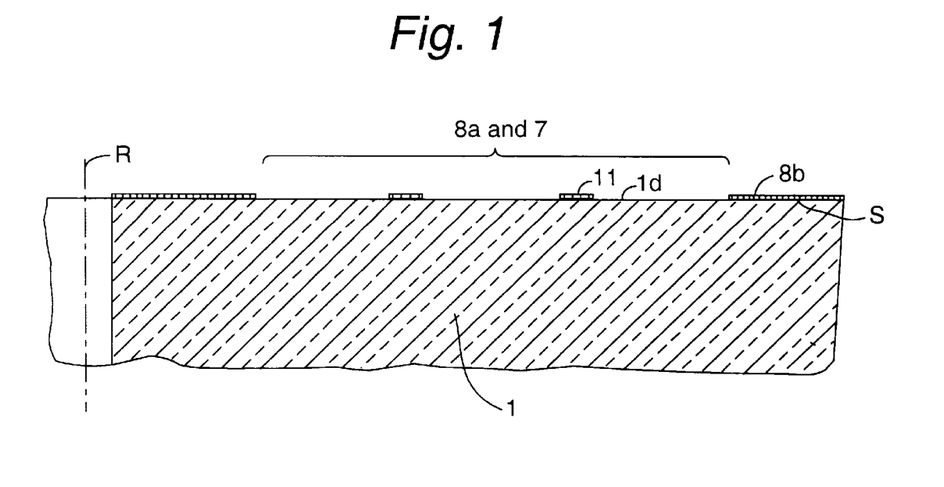
Figure 11:
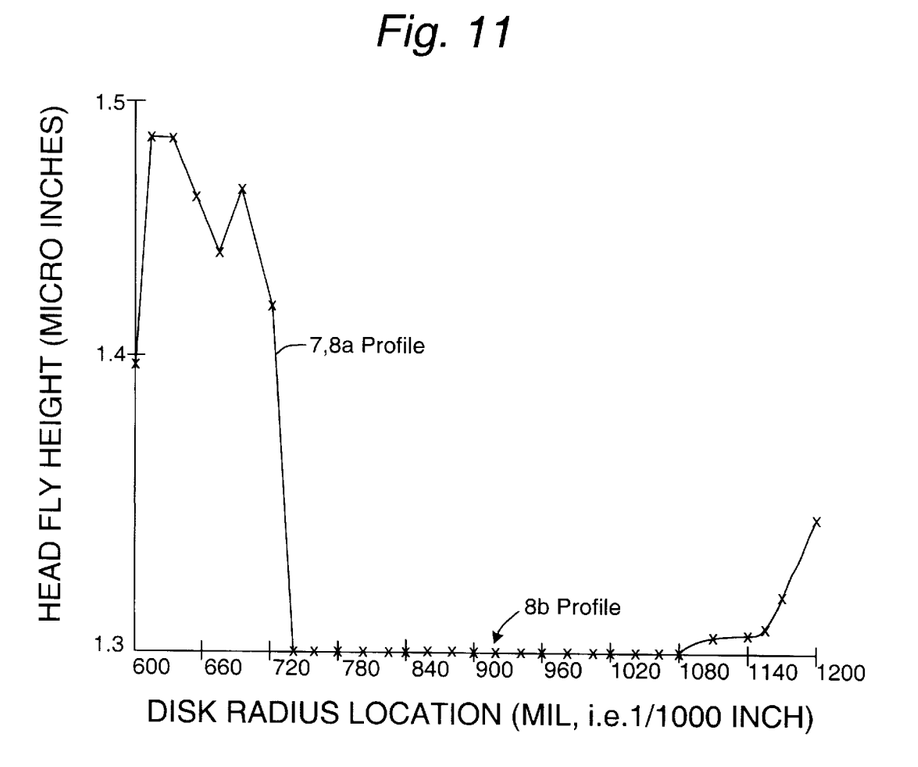
FIG. 11 depicts in the usual graph format optimal head glide characteristics produced through this invention.

As will be recognized, the printing or laying down of the dot pattern provides an etch resistant pattern or configuration which permits a chemical or possibly plasma etching to remove substrate material in the areas 1a between the printed indicia 11 shown, for example in FIGS. 1 and 11. After the etching of the unmasked areas has been completed, the masking indicia or dots 11 may be removed by appropriate cleaning operations, now well recognized in the art, so as to permit the subsequent, second stage of micro-texturing to take place.

Figure 6:
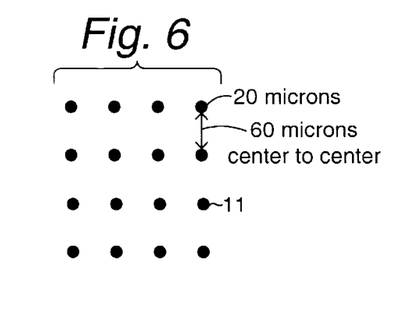
FIG. 6 schematically illustrates a representative dot masking pattern which may be applied, for example, to the ID-located head landing zone of the glass disc substrate, as depicted in FIG. 2.

As is shown in FIG. 6, the printed dots 11, in a representative pattern may, have a diameter of about 20 microns, with a center to center spacing of about 60 microns, and be oriented in a regular grid pattern, aligned on orthogonal axes extending transversely across the substrate surface S.

Figure 7:
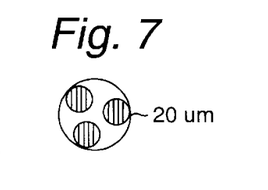
FIGS. 7 and 8 show alternative patterns of masking which may be employed to permit subsequent etching of the substrate to provide a spaced array of alternating micro-texturing peaks and valleys.
Figure 8:
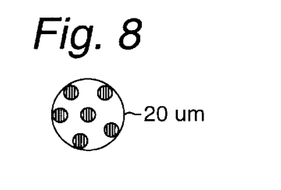

FIGS. 7 and 8 illustrate alternative patterns which may be employed for the dot indicia 11. FIG. 7 shows an arrangement by which, instead of employing solid, 20 micron diameter dots, three 8 micron diameter dots may be located within a circle of about 20 microns, each such array taking the place of a single 20 micron dot shown in FIG. 6.

FIG. 8 shows another exemplary modification, entailing even smaller dot configurations, i.e., an arrangement where six, 6 micron diameter dots are confined within a diameter of about 20 microns, each such array taking the place of a single 20 micron dot shown in the FIG. 6 pattern.

Obviously, other printing or pattern arrays for the masking elements 11 may be created and utilized, the-selection of such being believed to be well within the skill of the art of the present time.

Second Stage—Rounded, Minute Globule Peak Array

Techniques for sputter depositing rounded globules of eutectic alloys are described in detail in the publication of Teng et al, noted above. The sputter deposition of peritectic alloy materials to produce micro-texturing, rounded globules is described in the pending application of Mahvan et al, Ser. No. 959,986, filed Oct. 13, 1992, and assigned to the assignee of the present application.

With respect to detailed aspects of possible representative implementation of the second stage of micro-texturing of this invention, the disclosures of the aforesaid Teng et al publication and Mahvan et al pending application are herein incorporated by reference.

By way of summary, this second stage, micro-texturing operation, as shown in FIG. 4, in a presently preferred embodiment, produces:

a) a disc substrate 1;

b) an etched portion 2 of the substrate 1 providing a first, spaced array 3 of micro-texturing components comprising dispersed recesses 4 projecting inwardly into the body of the substrate 1 and defining a first array of dispersed peaks 5;

c) a sputter deposited second, spaced array 8 of micro-texturing components comprising spaced, generally rounded globules 9 including an overlying portion 8a superimposed over the etched substrate 1 and recesses 4 projecting thereunto, with the second, spaced array 8 projecting upwardly, generally away from the etched substrate 1 and recesses 4 projecting thereunto and defining a second array of dispersed peaks 10 elevated from the first array 1 of dispersed peaks 5 and projecting above original substrate surfaces;

d) the sputter deposited globules 9 comprising a material whose chemical composition is diverse from that of the etched substrate; and e) the etching and depositing above noted being operable to form a compositely micro-textured substrate for receiving sputter deposited, thin-film, magnetic media, this substrate being characterized by i) superimposed, physically disparate, micro-texturing defined by rounded globules 9 projecting outwardly of the substrates and etched recesses 4 projecting inwardly into the substrate 1; and ii) superimposed, chemically disparate micro-texturing defined by the superimposed first and second arrays 3 and 8, respectively, of micro-texturing components 6 and 10 comprised of diverse chemical composition.

Sputter deposited, thin film, magnetic media comprising magnetic layers, interface layer means, and a protective outer coat, is deposited over this compositely micro-textured substrates and itself becomes micro-textured in response to the presence of the underlying composite, micro-texturing of the substrate, albeit, to a somewhat lesser degree.

In the presently preferred application of the invention, a disc is produced wherein:

the first, spaced array 1 of micro-texturing components is confined to an inner diameter portion 7 of the disc substrate 1, over which a magnetic head would come to rest in response to a normal cessation of disc traversing operations;

the second, spaced array 8 of micro-texturing components, comprising the generally rounded globules 9, is dispersed so as to overlie the inner diameter portion 7 of the substrate 1 (i.e. portion 8a) and extend radially outwardly thereof (i.e., the portion 8b extending in the direction E of FIG. 2);

the confining of the first, spaced array 1 of micro-texturing to an inner diameter portion 7 of the substrate serving to substantially confine modulation disparities resulting from the etching to a normal, head landing zone 7 over the substrate 1;

the overlying portion 8a, and radially outward extension 8b, of the second, spaced array 8 of micro-texturing components, comprising the generally rounded globules 9, define a stiction resistant area substantially covering the entire portion of the substrate traversed by the magnetic head and maintaining optimal head glide characteristics radially outward of the head landing zone 7;

the first array 3 of dispersed peaks 5 on column-like means 6 is characterized by a relatively low frequency of occurance and has an average peak spacing x, measured across the substrate 1, which is substantially greater than the average peak spacing a of the generally rounded globules 8 (measured tip center to tip center of globules 9), with the average peak spacing x of the first array 3 of dispersed peaks 5 being about 60 microns, i.e., normally within a range of about 40 to 70 microns, and the peaks 5 of the first array of dispersed columns 6 are generally columnar and have a diameter x of about 20 microns, i.e., normally with a range of about 10 to 30 microns, and the average peak spacing a of the generally rounded globules 9 being about $1 \times 10^{-1}$ microns, i.e., normally within a range of about 8 to $12 \times 10^{-2}$ microns; and the first array 3 of dispersed peaks 5 is characterized by relatively low elevation y having an average elevation, measured normal to and from original surface S of substrate surface 1, which is substantially less than the average peak elevation b of the generally rounded globules 8 measured normal to and relative to the plane or surface S of the substrate containing the first array of dispersed peaks 5, with the average elevation y of the first array of dispersed peaks 5 being about $2 \times 10^{-2}$ microns, i.e., normally with a range of about 1.5 to $2.5 \times 10^{-2}$ microns, and the average peak elevation b of the generally rounded globules 8 being about $5 \times 10^{-2}$ microns, i.e., normally within a range of about 3 to $5 \times 10^{-2}$ microns.

Subsequent to the depositing of the second stage of micro-texturing, possibly a chrome underlayer, and possibly a CoCrPt containing alloy magnetic layer, and possibly carbon overcoat may be sequentially sputter deposited on top of globule layer. The globule layer melting point, film thickness, substrate surface energy, and temperature may significantly affect the properties and characteristics of the sputter-induced micro texturing (SIMT) comprising the array 8. By controlling process parameters, the number of globule texturing summits 10a at the desired threshold level can be increased significantly without changing the surface roughness as measured by optical interferometry. Consequently, disk stiction can be greatly improved without deteriorating glide performance.

To achieve ultra high magnetic recording density in disk drives, the recording head and disk must be very nearly in contact. This requires a disk with smoother surface but lower stiction. Thus the surface roughness and texturing will be key elements in recording effectiveness. Virtually all thin film disks for magnetic data storage use either mechanically textured NiP (Nickel Phospate) plated Al (Aluminum) substrates or smooth alternate substrates such as glass or ceramaterial. Mechanical texturing on NiP may achieve acceptably low stiction but produce a higher glide height. Smooth substrates may achieve lower glide heights but at the price of high stiction.

By referring to FIG. 7 of the aforesaid Teng et al publication, it will be better appreciated how the globule micro-texturing (referred to as sputter induced micro texturing or SIMT) truly enhances modulation properties of a media disc. With a normal, aluminum substrate (relatively rough surfaced), the observed signal waveform evidences good low frequency modulation but poor high frequency modulation (note curve A of FIG. 7 of this publication). With a glass substrate, not textured, the signal waveform shows reasonable high frequency modulation but poor low frequency modulation (see curve B of FIG. 7 of this publication). However, with the SIMT structure, a glass disc micro-textured with eutectic alloy globules, as above described, displays a signal waveform possessing the best, and significantly improved modulation, at both high and low frequencies (see curve C of FIG. 7 of this publication).

Thus, with the confinement of the relatively coarse, etching stage of micro texturing of the present invention to the ID (inner diameter) landing zone 7, and the utilization of the SIMT micro-texturing in the normal working zone 8a of the disk, radially displaced from the normal landing zone, the enhanced signal modulation characteristics resulting from SIMT treatment are attained for the usual read/write operations of the disk. In the normal ID, landing zone 7 of this invention, where composite, micro-texturing exists, signal modulation more or less like that of curve A of FIG. 7 of the aforesaid Teng et al publication is experienced—but it is now confined to the landing zone.

The multilayer films of seedlayer (i.e., globules), media layers, and carbon of the present invention may be deposited on substrates by commercially available, in-line DC/RF magnetron sputtering systems.

The second stage, micro-texturing layer of this invention uniquely provides a micro-texturing and performs a seed layer function, generally consistent with the observations of the aforesaid Teng et al publication.

As presently advised, the second micro-texturing stage is formed by sputtering with eutectic alloy targets comprising Indium (about 65% by weight) and Bismuth (about 35% by weight). This produces eutectic alloy globules 8 of essentially the same composites which do not interact with the media layers as contemplated by prior art such as the above listed Baseman et al patents.

Sputter-induced random micro texturing (SIMT) has been developed for both NiP/Al and alternate substrate disks, such entailing the deposition of the micro-texturing seedlayer. The grain size of media layers of disks with SIMT structure has been noted to be several times larger than that of disks without SIMT structure, and results in desirably, somewhat rougher surfaces, i.e., outer surfaces of the final disc product. The seedlayer melting point and substrate surface energy have to be compatible to yield even grain distribution with spherical globule features. Improper substrate temperature and too thick a seedlayer could cause abnormally large grains and isolated high spots which could impact the disk glide and CSS performance. By controlling process parameters within the skill level and knowledge of present practitioner of this art, super-smooth alternate substrate disks with SIMT have been produced and demonstrated an appropriate 1 microinch glide height capability and exceptionally good waveform modulation.

SUMMARY OF BASIC ASPECTS OF INVENTION

Figure 5:
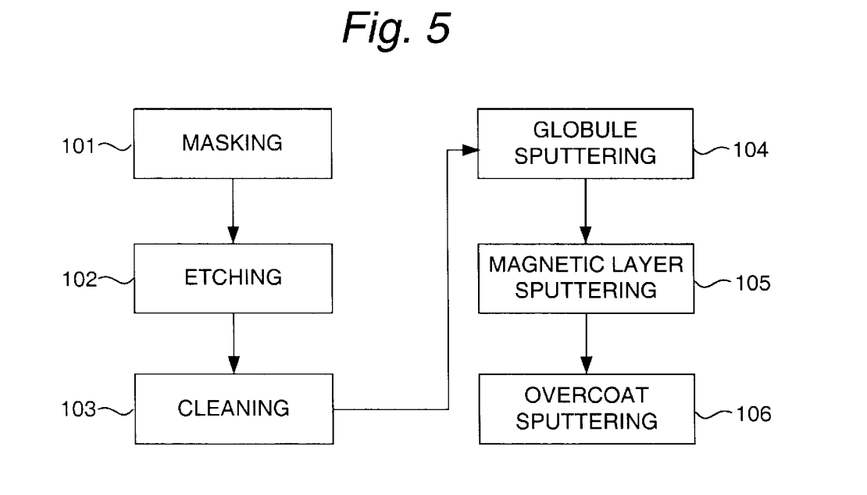
Figure 9A:
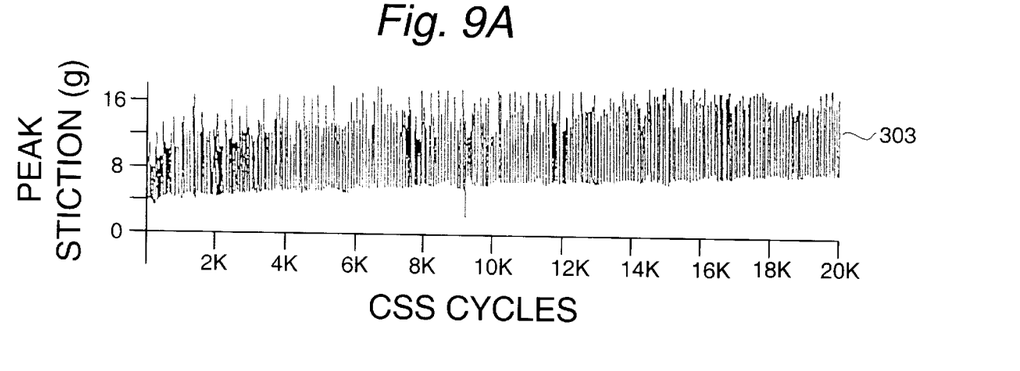
FIGS. 9A, 9B, 9C and 9D provide a graphic depiction showing the relative stiction characteristics of (FIG. 9A) a glass disc lacking the composite micro-texturing of the present invention, (FIG. 9B) a glass disc having the relatively high frequency dispersion of sputter deposited, rounded, micro-texturing globules as noted above, (FIG. 9C) a glass disc provided with the masking and etching, low frequency dispersion of texturing peaks as described above, and (FIG. 9D) a glass disc provided with the composite micro-texturing of the present invention and illustrating a significant improvement in stiction characteristics, affording improvements going markedly beyond mere additive results.
Figure 9B:
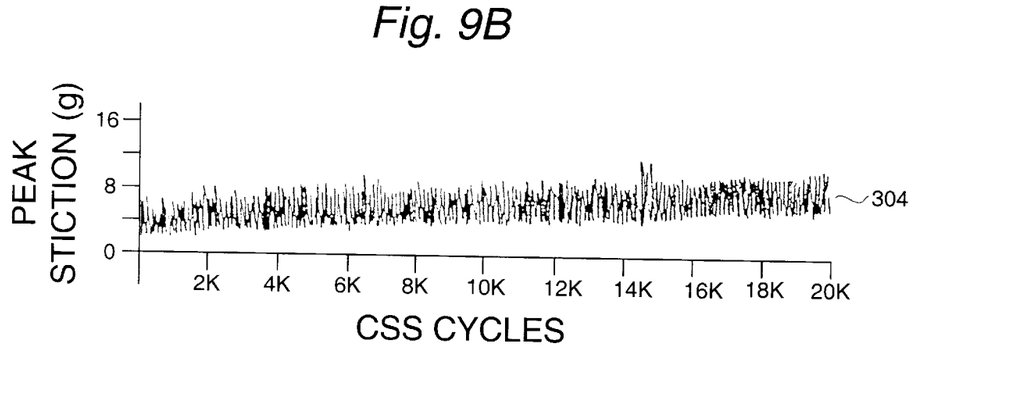
Figure 9C:
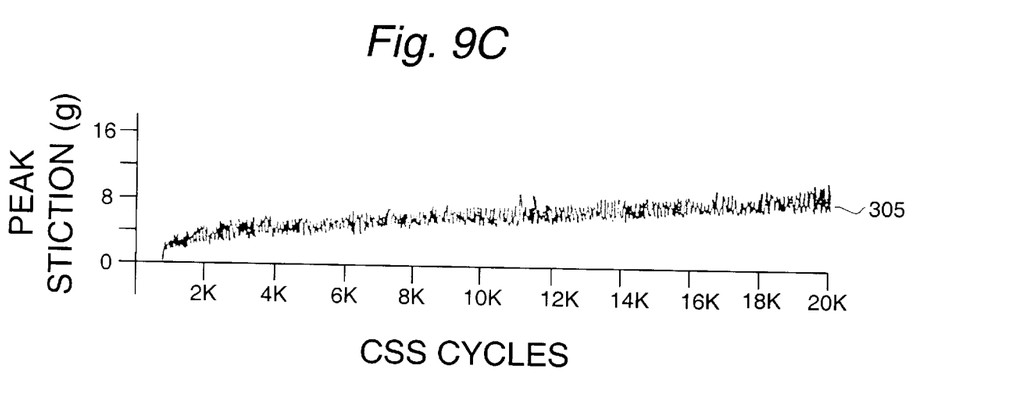
Figure 9D:
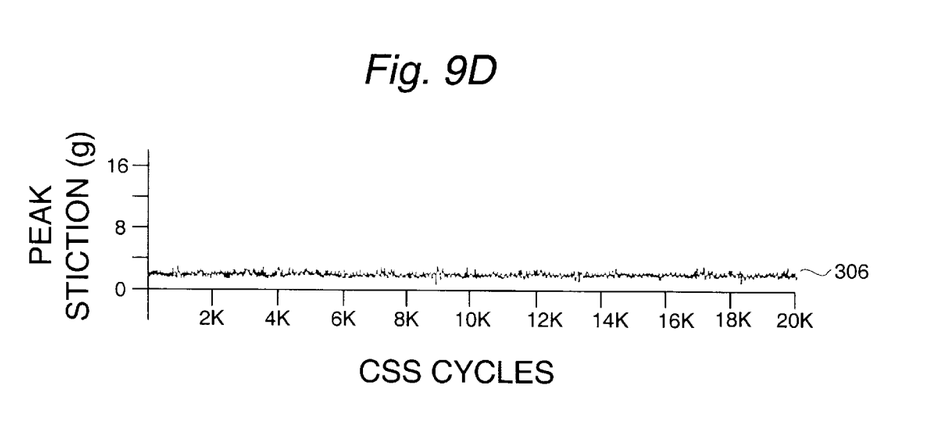
Figure 10:
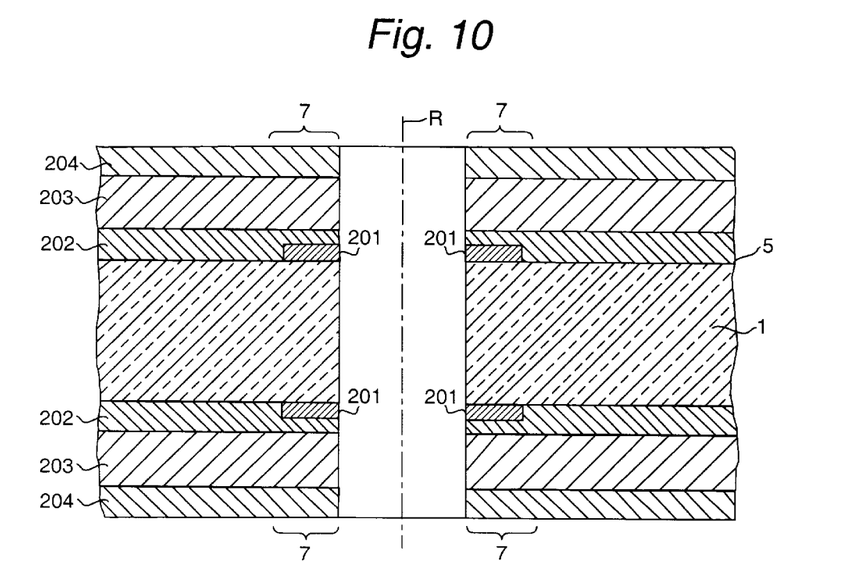
FIG. 10, in a schematic, cross sectional format, illustrates the various strata of a completed disc.

At this point, it is useful to basically summarize the invention by referring to the sequence of steps of FIG. 5, the completed disc product depicted schematically in FIG. 10, and relative, synergistic improvements in stiction characteristics indicated by the test results depicted in FIG. 9.

As shown in FIG. 5, the substrate surface S is masked by applying suitable masking indicia 11 in a desired pattern (step 101 shown in FIG. 5).

In the second step 102, etching of the substrate 1 between the dot elements 11 is effected so as to produce the first array 3 of peaks 5 as shown, schematically, in FIG. 2.

In the third step 103, the masking indicia or dots 11 are removed, thereby preparing the discs with the etched first stage of micro-texturing for the second stage of micro-texturing entailing the sputter deposition of rounded globules 8, so as to provide the second array of peaks 10. This globule deposition is shown as fourth step 104 in FIG. 5.

In the fifth step of the process, as depicted in FIG. 5, the compositon of which is determined within the skill of the art and pursuant to customer requirements are applied by sputtering. Such layers normally comprise a first interface layer such as chromium, one or more actual magnetic media layers comprising composite, magnetizable alloys, possibly separated by interface layers. A final, sputtered protective overcoat layer may be applied as shown in final stage 106 of FIG. 5. The final protective layer may comprise sputter deposited carbon.

The net result of this process is to produce a media disc as shown in FIG. 10 comprising the substrate 1, a first strata 201 containing the first stage of micro-texturing as above described, a second strata 202 containing the second stage of micro-texturing as above described, the composite, sputter deposited, multi layer media strata 203, and the protective overcoat or outer layer 204 comprising sputtered carbon, usually post-treated by the application of suitable lubricant materials, often teflon based.

In this connection, it should be kept in mind that the media itself may advantageously incorporate flash chromium interface layers between magnetizable media layers, consistent with the novel concept described in the pending applications of Teng and Eltoukhy, Ser. No. 887,187, filed May 21, 1992 entitled Flash Chromium Interlayer For Improved Hard Disc Magnetic Recording Peformance, and assigned to the assignee of the present invention.

Observations to date indicate that with the techniques described above, i.e., with the composite micro-texturing in the area of the disc landing zone, and with the second stage of micro-texturing extending across the entire operating radius of the disc, modulation disparities attributable to the relatively coarse micro-texturing produced by the etching stage are confined to the normal landing zone. Thus, such modulation disparities do not impair the normal, magnetic operating characteristics of the working zone of the disc, i.e., the zone 8b radially outside the landing zone 7.

As is shown in FIGS. 9a To 9D this arrangement produces a synergistic interaction, remarkably and unexpectedly improving stiction characteristics of the disc.

In curve of FIG. 9A, wherein a glass substrate was not provided with micro-texturing, the contact start stop (CSS) characteristics evidence a high degree of unwanted stiction. The test results depicted by the CSS test results shown by curve 304 relate to the evaluation of a glass substrate provided only with the eutectic alloy globule, micro-texturing of the present invention. Curve 304 depicts significant improvements in CSS characteristics, as compared with the untreated disc which is the subject of curve 303.

The third curve of FIG. 9C, i.e., curve 305, relates to the evaluation of a glass substrate disc provided only with the low frequency first stage micro-texturing produced by the masking/etching techniques earlier considered. Curve 305 illustrates a relative improvement in stiction characteristics.

The fourth curve 306 pertains to the evaluation of a glass disc substrate provided with both the high frequency micro-texturing 8 (i.e., eutectic alloy globules) and the low frequency micro-texturing 3 (produced by masking/etching). The extraordinary improvement in stiction characteristics depicted in curve 306 clearly indicates improvements going far beyond those which would be ascribable to or anticipable as mere additive results in relation to the discs evaluated in curves 304 and 305.

Turning now to the issue of the maintenance of optimal, head glide properties, reference will be made to the Glide Map depiction of FIG. 11.

As there shown, the head fly height profile for the landing zone 7, i.e., the compositely microtextured, ID zone 8a, show a maximum fly height of merely 1.5 micro inches. This relatively high gap is diminished by about $2/10$ (0.2) micro-inches (about 50 Angstroms) in the normal read/write or working zone 8b, i.e., the disk zone radially outward of the landing zone 7.

This means that, through the present invention, overall stiction control enhancement across the entire disk is achieve while, in the working zone 8b, an optimum, low glide height is achieved, along with low signal modulation for both low and high frequencies. In short, the best of all worlds is achieved in operating characteristics.

Basic overall aspects of the invention may now be summarized, with details of each stage of the micro-texturing operation, apparatus, and disc having been reviewed and described above.

In a method sense, these basic aspects reside in the following combination concepts, it being recognized that direct apparatus and disc counterparts of the method aspects of the invention co-exist with the related method.

First and foremost, a base method of compositely micro-texturing thin film, magnetic discs is contemplated, this method comprising:

a) providing a disc substrate 1;

b) etching substrate I to provide a first, spaced array 3 of micro-texturing components comprising dispersed recesses 4 projecting inwardly into the body of substrate 1 and defining a first array of dispersed peaks 5; and c) sputter depositing a second, spaced array 8 of micro-texturing components comprising spaced, generally rounded globules 9 superimposed over the etched substrate 1 and recesses 4 projecting thereunto, with the second, spaced array 8 projecting upwardly, generally away from surface S of etched substrate 1 and recesses 4 projecting thereunto and defining a second array 8 of dispersed peaks 10 elevated from the first array 3 of dispersed peaks 5;

d) the sputter deposited globules 9 comprising a material whose chemical composition is diverse from that of the etched substrate 1; and e) the aforesaid etching and depositing being operable to form a compositely micro-textured substrate 1 for receiving sputter deposited, thin-film magnetic media, 203, 204 which substrate is characterized by i) superimposed, physically disparate, micro-texturing 201 and 202 defined by rounded globules 9 projecting outwardly of the substrate 1 and etched recesses 4 projecting inwardly into this substrate; and ii) superimposed, chemically disparate micro-texturing 201 and 202 defined by said superimposed first and second arrays, 3 and 8 respectively, of micro-texturing components comprised of diverse chemical composition.

In a more redefined application a method of compositely micro-texturing thin film, magnetic discs, is presented which comprises:

a) providing a disc substrate 1;

b) etching the substrate 1 to provide a first, spaced array 3 of micro-texturing components comprising dispersed recesses 4 projecting inwardly into the body of said substrate 1; and c) sputter depositing a second, spaced array 8 of micro-texturing components comprising spaced, generally rounded metallic globules 9 superimposed over the etched substrate 1 and recesses 4 projecting thereunto, with this second, spaced array 8 projecting upwardly, generally away from the etched substrate surface S and recesses 4 projecting thereunto and defining a second array of dispersed peaks 10 elevated from said first array of dispersed peaks;

d) the sputter deposited globules 9 comprising a eutectic alloy whose chemical composition is diverse from that of the etched portion of the substrate 1 and with this eutectic alloy comprising Indium and Bismuth; and e) the etching and depositing being operable to form a compositely micro-textured substrate 1 for receiving sputter deposited, thin-film, magnetic media 203, 204, which substrate is characterized by i) superimposed, physically disparate, micro-texturing 201 and 202 defined by rounded metallic globules 9 projecting outwardly of the substrate 1 and etched recesses 4 projecting inwardly into this substrate; and ii) superimposed, chemically disparate micro-texturing 201 and 202 defined by the superimposed first and second arrays, 3 and 8 respectively, of micro-texturing components comprised of diverse chemical composition.

In a further, and even more specific sense, the method herein presented may ential:

a) providing a glass disc substrate 1 having masking 11 defining a spaced array of unmasked areas 1a;

b) etching the unmasked areas of the glass substrate to provide a first, spaced array 3 of micro-texturing components comprising dispersed recesses 4 projecting inwardly into the body of the glass substrate 1 and defining a first array of dispersed peaks 5; and c) sputter depositing a second, spaced array 8 of micro-texturing components comprising spaced, generally rounded, metallic globules 9 superimposed 8a over the etched glass substrate 1 and recesses 4 projecting thereunto, with the second spaced array 8 projecting upwardly, generally away from the etched glass substrate surface S and recesses 4 projecting thereunto and defining a second array of dispersed peaks 10 elevated from the first array of dispersed peaks 5;

d) the sputter deposited globules 9 comprising a eutectic alloy whose chemical composition is diverse from that of the etched glass substrate 1, with this eutectic alloy comprising Indium and Bismuth; and e) the etching and depositing being operable to form a compositely micro-textured glass substrate for receiving sputter deposited, thin-film, magnetic media 203, 204, which glass substrate 1 is characterized by i) superimposed, physically disparate, micro-texturing 201 and 202 defined by rounded metallic globules 9 projecting outwardly of the glass substrate 1 and etched recesses 4 projecting inwardly into the glass substrate; and ii) superimposed, chemically disparate micro-texturing 201 and 202 defined by the superimposed first and second arrays of micro-texturing components 3 and 8 respectively, comprised of diverse chemical composition, with the first array 3 comprising recessed glass 4 and the second array comprising metallic globules 9.

SUMMARY OF DETAILED ASPECTS OF THE INVENTION

In the context of the basic method, apparatus, and basic disc aspects of the invention as above noted, particularly efficacious results are believed to be derived from detailed implementation of the invention, characterized in the method concepts of the invention as follows (such of course being mirrored in counterpart apparatus and disc aspects:

Any method as described above wherein:

the first, spaced array 3 of micro-texturing components is confined to an inner diameter portion 7 of the disc substrate, over which a magnetic head would come to rest in response to a normal cessation of disc traversing operations;

the second, spaced array 8 of micro-texturing components, comprising the generally rounded globules 8, is dispersed to as to overlie 8a said inner diameter portion 7 of the substrate 1 and extend radially outwardly 8b thereof;

the confining of the first, spaced array 3 of micro-texturing to an inner diameter portion 7 of the substrate substantially confining modulation disparities resulting from the etching to a normal, head landing zone 7 over the substrate 1;

the overlying portion 8a, and radially outward extension 8b, of the second, spaced array 8 of micro-texturing components, comprising the generally rounded globules 9, define a stiction resistant area substantially covering the entire portion of the substrate traversed by a magnetic head and maintaining optimal glide characteristics radially outward of the head landing zone 7;

the first array 3 of dispersed peaks 5 is characterized by a relatively low frequency of occurance and has an average peak spacing x, measured across the substrate, which is substantially greater than the average peak spacing a of generally rounded globules 9, with the average peak spacing x of the first array of dispersed peaks 5 being about 60 microns, and the peaks of the first array of dispersed peaks 5 being generally columnar 6 and having a diameter of about 20 microns, and the average peak spacing a of the generally rounded globules 9 being about $1 \times 10^{-1}$ microns; and the first array of dispersed peaks 5 is characterized by relatively low elevation y having an average elevation, measured normal to said substrate S, which is substantially less than the average peak elevation b of the generally rounded globules 9 measured normal to and relative to a plane S of the substrate 1 containing the first array of dispersed peaks 5, with the average elevation y of the first array of dispersed peaks 5 being about $2 \times 10^{-2}$ microns, and the average peak elevation b of the generally rounded globules 9 being about $5 \times 10^{-2}$ microns.

SUMMARY OF ADVANTAGES AND OVERALL SCOPE OF INVENTION

The unique, composite micro-texturing of the present invention entails a hitherto unrecognized and unaccomplished juxt a positioning of diverse, micro-texturing techniques so as to provide superposed, micro-texturing zones which are both chemically and physically disparate.

This arrangement, instead of providing the coarse peak/valley structure of the prior art with its attendant modulation disparaties, yields an acceptably low modulation characteristic over substantially the entire disc.

Significantly this is accomplished while permitting the overall stiction characteristics of the disc to remain uniform, across the entire disc surface traversed by the magnetic head of the disc drive apparatus involved. In addition, optimal head glide characteristics (i.e., a relatively low glide height) are maintained in the disk area radially displaced from the head landing zone.

By virtue of mechanisms not fully appreciated and certainly not apparant, it is believed that this synergistic result is achieved as a result of the utilization of the relatively coarse, etched peak and valley structure, substantially confined to the normal head landing zone of the disc, which is characterized by a low frequency of peak dispersion but relatively wide and low peaks, all this being displaced beneath the subsequently sputtered array of relatively minute, rounded globules of the eutectic alloy. The latter provides a rounded globule outer surface of the micro-textured area characterized by a high frequency occurance of peaks, with these peaks being relatively tiny in width but somewhat higher than the peaks produced by the first masking/etching stage.

Presently preferred dimensional ranges for the peaks of each of the first and second stage may be summarized as follows:

| Stage | Structure | Presently Preferred Range (Microns) |
|---|---|---|
| First | Average peak spacing (x) | about 40 to 70 |
| First | Average peak height (y) | about 1.5 to 2.5 × $10^{-2}$ |
| First | Average peak width (z) | about 10 to 30 |
| Second | Average peak spacing (a) | about 8 × $10^{-2}$ to 12 × $10^{-2}$ |
| Second | Average peak height (b) | about 3 to 5 × $10^{-2}$ |
| Second | Average peak width (c) | about 8 × $10^{-2}$ to 12 × $10^{-2}$ (consider this distance as being measured between the center of globule base merging). |

As will be readily understood, the drawings are merely schematic and not to scale and thus do not reflect relative actual sizes, consistent with these dimensions.

While the invention has been described with respect to presently preferred embodiments, those familiar with the micro-texturing art and this disclosure may well envision additions, deletions, substitutions, equivalents, modifications, and other changes all falling within the scope of the invention deemed to be set forth in the appended claims:

What is claimed is:

1. A method of compositely micro-texturing thin film, magnetic discs, said method comprising:
   a) providing a disc substrate;
   b) etching said substrate to provide a first, spaced array of micro-texturing components comprising dispersed recesses projecting inwardly into the body of said substrate and defining a first array of dispersed peaks; and
   c) sputter depositing a second, spaced array of micro-texturing components comprising spaced, generally rounded globules superimposed over said etched substrate and recesses projecting thereunto, with said second, spaced array projecting upwardly, generally away from said etched substrate and recesses projecting thereunto and defining a second array of dispersed peaks elevated from said first array of dispersed peaks;
   d) said sputter deposited globules comprising a material whose chemical composition is diverse from that of said etched substrate; and
   e) said etching and depositing being operable to form a compositely micro-textured substrate for receiving sputter deposited, thin-film magnetic media, which substrate is characterized by
      i) superimposed, physically disparate, micro-texturing defined by rounded globules projecting outwardly of said substrate and etched recesses projecting inwardly into said substrate; and
      ii) superimposed, chemically disparate micro-texturing defined by said superimposed first and second arrays of micro-texturing components comprised of diverse chemical composition;
   f) said method being characterized by the formation of micro-texturing comprising multiple superimposed zones of micro-texturing formed, respectively, by the etching induced removal of material from said disc and the sputtering deposition induced addition of texturing material to said disc forming projecting protrusions;
   g) said second, spaced array comprising rounded globules being sputter deposited over each of said first, spaced array of etching-formed, dispersed recesses and etching-formed, dispersed peaks with
      individual, etching-formed peaks and recesses each being operable to directly support a plurality of said rounded globules; and
   h) said superimposed, first and second, spaced arrays of etching-formed and rounded globule-formed micro-texturing components being collectively operable to micro-texture said thin film magnetic media sputtered upon said superimposed first and second arrays of disparate, micro-texturing;
   i) said superimposing of said sputtered, rounded globules over said first, spaced array of etching-induced micro-texturing producing a frequency of texturing peak occurrence which is greater than and modifies the frequency of peak occurrence produced by said first array of dispersed peaks; and
   j) said superimposing of sputtered, rounded globules over said etching-formed, first spaced array of micro-texturing is operable to reduce stiction characteristics to a level less than that which would result from the presence of either said etching formed, first spaced array or said sputtered, rounded globule formed, second spaced array.

2. A method as described in claim 1 wherein:
   said first, spaced array of micro-texturing components is confined to an inner diameter portion of said disc substrate, over which a magnetic head would come to rest in response to a normal cessation of disc traversing operations;
   said second, spaced array of micro-texturing components, comprising said generally rounded globules, is dispersed so as to overlie said inner diameter portion of said substrate and extend radially outwardly thereof;
   said confining of first, spaced array of micro-texturing to an inner diameter portion of said substrate substantially confining modulation disparities resulting from said etching to a normal, head landing zone over said substrate; and said overlying portion, and radially outward extension, of said second, spaced array of micro-texturing components, comprising said generally rounded globules, defining a stiction resistant area substantially covering the entire portion of said substrate traversed by said magnetic head and maintaining optimal glide characteristics radially outward of said head landing zone.

3. A method as described in claim 1 wherein said first array of dispersed peaks has an average peak spacing, measured across said substrate, which is substantially greater than the average peak spacing of said generally rounded globules; and said first array of dispersed peaks is characterized by having an average elevation, measured normal to said substrate, which is substantially less than the average peak elevation of said generally rounded globules measured normal to and relative to a plane of said substrate containing said first array of dispersed peaks.

4. A method as described in claim 3 wherein:

said average peak spacing of said first array of dispersed peaks is from about 40 to 70 microns, with
said peaks being generally columnar and having a diameter of about 10 to 30 microns;

said average peak spacing of said generally rounded globules is from about $8 \times 10^{-2}$ to $12 \times 10^{-2}$ microns;

said average elevation of said first array of dispersed peaks is from about $1.5 \times 10^{-2}$ to $2.5 \times 10^{-2}$ microns; and said average peak elevation of said generally rounded globules is about $3 \times 10^{-2}$ to $5 \times 10^{-2}$ microns.

5. A method as described in claim 1 wherein:

said first, spaced array of micro-texturing components is confined to an inner diameter portion of said disc substrate, over which a magnetic head would come to rest in response to a normal cessation of disc traversing operations;

said second, spaced array of micro-texturing components, comprising said generally rounded globules is dispersed so as to overlie said inner diameter portion of said substrate and extend radially outwardly thereof;

said confining of said first, spaced array of micro-texturing to an inner diameter portion of said substrate substantially confining modulation disparities resulting from said etching to a normal, heading landing zone over said substrate;

said overlying portion, and radially outwardly extension, of said second, spaced array of micro-texturing components, comprising said generally rounded globules, defining a stiction resistant area substantially covering the entire portion of said substrate traversed by said magnetic head and maintaining optimal glide characteristics radially outward of said head landing zone;

said first array of dispersed peaks has an average peak spacing, measured across said substrate, which is substantially greater than the average peak spacing of generally rounded globules, with
said average peak spacing of said first array of dispersed peaks being about 65 microns, and
said peaks of said first array of dispersed peaks being generally columnar and having a diameter of about 20 microns, and
said average peak spacing of said generally rounded globules being about $1 \times 10^{-1}$ microns; and said first array of dispersed peaks is characterized by having an average elevation, measured normal to said substrate, which is substantially less than the average peak elevation of said generally rounded globules measured normal to and relative to a plane of said substrate containing said first array of dispersed peaks, with
said average elevation of said first array of dispersed peaks being about $2 \times 10^{-2}$ microns, and
said average peak elevation of said generally rounded globules being about $5 \times 10^{-2}$ microns.

6. A method of compositely micro-texturing thin film, magnetic discs, said method comprising:

a) providing a disc substrate;

b) etching said substrate to provide a first, spaced array of micro-texturing components comprising dispersed recesses projecting inwardly into the body of said substrate; and c) sputter depositing a second, spaced array of micro-texturing components comprising spaced, generally rounded metallic globules superimposed over said etched substrate and recesses projecting thereunto, with said second, spaced array projecting upwardly, generally away from said etched substrate and recesses projecting thereunto and defining a second array of dispersed peaks elevated from said first array of dispersed peaks;

d) said sputter deposited globules comprising a eutectic alloy whose chemical composition is diverse from that of said etched portion of said substrate with said eutectic alloy comprising Indium and Bismuth; and e) said etching and depositing being operable to form a compositely micro-textured substrate for receiving sputter deposited, thin-film, magnetic media, which substrate is characterized by
i) superimposed, physically disparate, micro-texturing defined by rounded metallic globules projecting outwardly of said substrate and etched recesses projecting inwardly into said substrate; and
ii) superimposed, chemically disparate micro-texturing defined by said superimposed first and second arrays of micro-texturing components comprised of diverse chemical composition;

f) said method being characterized by the formation of micro-texturing comprising multiple superimposed zones of micro-texturing formed, respectively, by the etching induced removal of material from said disc and the sputtering deposition induced addition of texturing material to said disc forming projecting protrusions;

g) said second, spaced array comprising rounded globules being sputter deposited over each of said first, spaced array of etching-formed, dispersed recesses and etching-formed, dispersed peaks with
individual, etching-formed peaks and recesses each being operable to directly support a plurality of said rounded globules; and h) said superimposed, first and second, spaced arrays of etching-formed and rounded globule-formed micro-texturing components being collectively operable to micro-texture said thin-film magnetic media sputtered upon said superimposed first and second arrays of disparate, micro-texturing;

i) said superimposing of said sputtered, rounded globules over said first, spaced array of etching-induced micro-texturing producing a frequency of texturing peak occurrence which is greater than and modifies the frequency of peak occurrence produced by said first array of dispersed peaks; and said superimposing of sputtered, rounded globules over said etching-formed, first spaced array of micro-texturing is operable to reduce stiction characteristics to a level less than that which would result from the presence of either said etching formed, first spaced array or said sputtered, rounded globule formed, second spaced array.

7. A method as described in claim 6 wherein:

said first, spaced array of micro-texturing components is confined to an inner diameter portion of said disc substrate, over which a magnetic head would come to reset in response to a normal cessation of disc traversing operations;

said second, spaced array of micro-texturing components, comprising said generally rounded globules of a eutectic alloy of Indium and Bismuth, is dispersed so as to overlie said inner diameter portion of said substrate and extend radially outwardly thereof;

said confining of said first, spaced array of micro-texturing to an inner diameter portion of said substrate substantially confining modulation disparities resulting from said etching to a normal, head landing zone over said substrate; and said overlying portion, and radially outward extension, of said second, spaced array of micro-texturing components, comprising said-generally rounded globules, defining a stiction resistant area substantially covering the entire portion of said substrate traversed by said magnetic head and maintaining optimal glide characteristics radially outward of said head landing zone.

8. A method as described in claim 6 wherein:

said first array of dispersed peaks has an average peak spacing, measured across said substrate, which is substantially greater than the average peak spacing of said generally rounded globules of said eutectic alloy of Indium and Bismuth; and said first array of dispersed peaks is characterized by having an average elevation, measured normal to said substrate, which is substantially less than the average peak elevation of said generally rounded globules of said eutectic alloy of Indium and Bismuth measured normal to and relative to a plane of said substrate containing said first array of dispersed peaks.

9. A method as described in claim 8 wherein:

said average peak spacing of said first array of dispersed peaks is from about 40 to to 70 microns, with
said peaks being generally columnar and having a diameter of about 10 to 30 microns;

said average peak spacing of said generally rounded globules of said eutectic alloy of Indium and Bismuth is from about $8 \times 10^{-2}$ to $12 \times 10^{-2}$ microns;

said average elevation of said first array of dispersed peaks is from about $1.5 \times 10^{-2}$ to $2.5 \times 10^{-2}$ microns; and said average peak elevation of said generally rounded globules is about $3 \times 10^{-2}$ to $5 \times 10^{-2}$ microns.

10. A method as described in claim 6 wherein:

said first, spaced array of micro-texturing components is confined to an inner diameter portion of said disc substrate, over which a magnetic head would come to rest in response to a normal cessation of disc traversing operations;

said second, spaced array of micro-texturing components, comprising said generally rounded globules of a eutectic alloy of Indium and Bismuth, is dispersed so as to overlie said inner diameter portion of said substrate and extend radially outwardly thereof;

said confining of said first, spaced array of micro-texturing to an inner diameter portion of said substrate substantially confining modulation disparaties resulting from said etching to a normal, head landing zone over said substrate;

said overlying portion, and radially outward extension, of said second, spaced array of micro-texturing components, comprising said generally rounded globules, defining a stiction resistant area substantially covering the entire portion of said substrate traversed by said magnetic head and maintaining optimal glide characteristics radially outward of said head landing zone;

said first array of dispersed peaks has an average peak spacing, measured across said substrate, which is substantially greater than the average peak spacing of generally rounded globules, with
said average peak spacing of said first array of dispersed peaks being about 65 microns, and
said peaks of said first array of dispersed peaks being generally columnar and having a diameter of about 20 microns, and
said average peak spacing of said generally rounded globules being about $1 \times 10^{-1}$ microns; and said first array of dispersed peaks is characterized by having an average elevation, measured normal to said substrate, which is substantially less than the average peak elevation of said generally rounded globules measured normal to and relative to a plane of said substrate containing said first array of dispersed peaks, with
said average elevation of said first array of dispersed peaks being about $2 \times 10^{-2}$ microns, and
said average peak elevation of said generally rounded globules being about $5 \times 10^{-2}$ microns.

11. A method of compositely micro-texturing thin film, magnetic discs, said method comprising a) providing a glass disc substrate having masking defining a spaced array of unmasked areas;

b) etching said masked areas of said glass substrate to provide a first, spaced array of micro-texturing components comprising dispersed recesses projecting inwardly into the body of said glass substrate and defining a first array of dispersed peaks; and c) sputter depositing a second, spaced array of micro-texturing components comprising spaced, generally rounded, metallic globules superimposed over said etched glass substrate and recesses projecting thereunto, with said second spaced array projecting upwardly, generally away from said etched glass substrate and recesses projecting thereunto and defining a second array of dispersed peaks elevated from said first array of dispersed peaks;

d) said sputter deposited globules comprising a eutectic alloy whose chemical composition is diverse from that of said etched substrate, with said eutectic alloy comprising Indium and Bismuth; and e) said etching and depositing being operable to form a compositely, micro-textured glass substrate for receiving sputter deposited, thin-film, magnetic media, which glass substrate is characterized by i) superimposed, physically disparate, micro-texturing defined by rounded metallic globules projecting outwardly of said glass substrate and etched recesses projecting inwardly into said glass substrate; and ii) superimposed, chemically disparate micro-texturing defined by superimposed first and second arrays of micro-texturing components comprised of diverse chemical composition, with said first array comprising recessed glass and said second array comprising metallic globules;

f) said method being characterized by the formation of micro-texturing comprising multiple superimposed zones of micro-texturing formed, respectively, by the etching induced removal of material from said disc and the sputtering deposition induced addition of texturing material to said disc forming projecting protrusions, g) said second, spaced array comprising rounded globules being sputter deposited over each of said first, spaced array of etching-formed, dispersed recesses and etching-formed, dispersed peaks with
 individual, etching-formed peaks and recesses each being operable to directly support a plurality of said rounded globules; and h) said superimposed, first and second, spaced arrays of etching-formed and rounded globule-formed micro-texturing components being collectively operable to micro-texture said thin-film magnetic media sputtered upon said superimposed first and second arrays of disparate, micro-texturing;

i) said superimposing of said sputtered, rounded globules over said first, spaced array of etching-induced micro-texturing producing a frequency of texturing peak occurrence which is greater than and modifies the frequency of peak occurrence produced by said first array of dispersed peaks; and said superimposing of sputtered, rounded globules over said etching-formed, first spaced array of micro-texturing is operable to reduce stiction characteristics to a level less than that which would result from the presence of either said etching formed, first spaced array or said sputtered, rounded globule formed, second spaced array.

12. A method as described in claim 11 wherein:

said first, spaced array of micro-texturing components is confined to an inner diameter portion of said glass disc substrate, over which a magnetic head would come to rest in response to a normal cessation of disc traversing operations;

said second, spaced array of micro-texturing components, comprising said generally rounded globules of a eutectic alloy of Indium and Bismuth, is dispersed to as to overlie said inner diameter portion of said substrate and extend radially outwardly thereof;

said confining of said first, spaced array of micro-texturing to an inner diameter portion of said substrate substantially confining modulation disparities resulting from said etching to a normal, head landing zone over said substrate; and said overlying portion, and radially outward extension, of said second, spaced array of micro-texturing components, comprising said generally rounded globules, defining a stiction resistant area substantially covering the entire portion of said substrate traversed by said magnetic head and maintaining optimal glide characteristics radially outward of said head landing zone.

13. A method as described in claim 11 wherein:

said first array of dispersed peaks has an average peak spacing, measured across said glass disc substrate, which is substantially greater than the average peak spacing of said generally rounded globules of said eutectic alloy of Indium and Bismuth; and said first array of dispersed peaks is characterized by having an average elevation, measured normal to said glass disc substrate, which is substantially less than the average peak elevation of said generally rounded globules of said eutectic alloy of Indium and Bismuth measured normal to and relative to a plane of said substrate containing said first array of dispersed peaks.

14. A method as described in claim 13 wherein:

said average peak spacing of said first array of dispersed peaks is from about 40 to 70 microns, with
 said peaks of said glass disc substrate being generally columnar and having a diameter of about 10 to 30 microns;

said average peak spacing of said generally rounded globules of said eutectic alloy of Indium and Bismuth is from about $8 \times 10^{-2}$ to $12 \times 10^{-2}$ microns;

said average elevation of said first array of dispersed peaks is from about $1.5 \times 10^{-2}$ to $2.5 \times 10^{-2}$ microns; and said average peak elevation of said generally rounded globules is about $3 \times 10^{-2}$ to $5 \times 10^{-2}$ microns.

15. A method as described in claim 11 wherein:

said first, spaced array of micro-texturing components is confined to an inner diameter portion of said glass disc substrate, over which a magnetic head would come to rest in response to a normal cessation of disc traversing operations;

said second, spaced array of micro-texturing components, comprising said generally rounded globules of a eutectic alloy of Indium and Bismuth, is dispersed so as to overlie said inner diameter portion of said substrate and extend radially outwardly thereof;

said confirming of said first, spaced array of micro-texturing to an inner diameter portion of said substrate substantially confining modulation disparities resulting from said etching to a normal, head landing zone over said substrate;

said overlying portion, and radially outward extension, of said second, spaced array of micro-texturing components, comprising said generally rounded globules, defining a stiction resistant area substantially covering the entire portion of said substrate traversed by said magnetic head and maintaining optimal glide characteristics radially outward of said head landing zone;

said first array of dispersed peaks has an average peak spacing, measured across said glass disc substrate, which is substantially greater than the average peak spacing of generally rounded globules of said eutectic alloy of Indium and Bismuth, with
 said average peak spacing of said first array of dispersed peaks of said glass disc substrate being about 65 microns, and
 said peaks of said first array of dispersed peaks being generally columnar and having a diameter of about 20 microns, and
 said average peak spacing of said generally rounded globules being about $1 \times 10^{-1}$ microns; and said first array of dispersed peaks is characterized by having an average elevation, measured normal to said glass disc substrate, which is substantially less than the average peak elevation of said generally rounded globules of said eutectic alloy of Indium and Bismuth measured normal to and relative to a plane of said substrate containing said first array of dispersed peaks, with
 said average elevation of said first array of dispersed peaks being about $2 \times 10^{-2}$ microns, and
 said average peak elevation of said generally rounded globules being about $5 \times 10^{-2}$ microns.

* * * * *